(12) United States Patent
Poirier

(10) Patent No.: US 11,835,398 B2
(45) Date of Patent: Dec. 5, 2023

(54) METHOD AND CIRCUIT FOR TEMPERATURE SENSING, TEMPERATURE SENSOR AND ELECTRICAL APPLIANCE

(71) Applicant: Sciosense B.V., Eindhoven (NL)

(72) Inventor: Sébastien Poirier, Valencia (ES)

(73) Assignee: Sciosense B.V., AE Eindhoven (NL)

( * ) Notice: Subject to any disclaimer, the term of this patent is extended or adjusted under 35 U.S.C. 154(b) by 336 days.

(21) Appl. No.: 16/972,388

(22) PCT Filed: Jun. 18, 2019

(86) PCT No.: PCT/EP2019/066052
§ 371 (c)(1),
(2) Date: Dec. 4, 2020

(87) PCT Pub. No.: WO2020/007604
PCT Pub. Date: Jan. 9, 2020

(65) Prior Publication Data
US 2021/0172808 A1  Jun. 10, 2021

(30) Foreign Application Priority Data
Jul. 2, 2018  (EP) ..................... 18181164

(51) Int. Cl.
*G01K 7/01* (2006.01)
*H03M 1/38* (2006.01)
*H03M 3/00* (2006.01)

(52) U.S. Cl.
CPC ............... *G01K 7/01* (2013.01); *H03M 1/38* (2013.01); *H03M 3/46* (2013.01); *G01K 2219/00* (2013.01)

(58) Field of Classification Search
CPC .. H03M 1/06; G01K 1/02; G01K 7/01; G01K 2219/00
See application file for complete search history.

(56) References Cited

U.S. PATENT DOCUMENTS 6,637,934 B1 * 10/2003 Henderson ............. G01K 1/028
374/170
7,855,562 B2 * 12/2010 Chiaburu ............. G01L 27/007
702/58

(Continued)

FOREIGN PATENT DOCUMENTS

| CN | 104300984 A | 1/2015 |
| CN | 104506196 A | 4/2015 |
| EP | 0338837 A2 | 10/1989 |

OTHER PUBLICATIONS

Lacanette, Kerry, Using Analog Temperature Sensors With ADCS, 2001, https://www.maximintegrated.com/en/design/technical-documents/app-notes/5/571.html (Year: 2001).*

(Continued)

*Primary Examiner* — Natalie Huls
(74) *Attorney, Agent, or Firm* — Slater Matsil, LLP

(57) ABSTRACT

In an embodiment a method includes providing an analog signal having a first value of a temperature of an object, performing an analog-to-digital conversion of the analog signal using a first analog-to-digital converter (ADC) thereby providing a first digital signal representing an initial digital temperature value, performing an analog-to-digital conversion of the analog signal using a second ADC thereby providing a second digital signal representing a digital reference temperature value, regularly providing the analog signal having a successive value of the temperature of the object, performing the analog-to-digital conversion of the analog signal using the second ADC thereby providing the second digital signal representing a successive digital temperature value, calculating a digital delta temperature value according to a difference between the successive digital temperature value and the digital reference temperature value and repeating portions of the method as long as the (Continued)

digital delta temperature value lies within a predefined range.

20 Claims, 3 Drawing Sheets

(56) References Cited

U.S. PATENT DOCUMENTS

| | | | | |
|---|---|---|---|---|
| 7,944,386 | B2* | 5/2011 | Hurrell | H03M 3/46 |
| | | | | 341/143 |
| 9,774,342 | B1* | 9/2017 | Schneider | H04R 3/02 |
| 9,998,134 | B1* | 6/2018 | Stepanovic | H03M 1/1014 |
| 2008/0258959 | A1 | 10/2008 | Trifonov et al. | |
| 2010/0097256 | A1* | 4/2010 | Hurrell | H03M 3/46 |
| | | | | 341/143 |
| 2012/0286984 | A1* | 11/2012 | Schimper | H03M 1/0881 |
| | | | | 341/144 |
| 2022/0069832 | A1* | 3/2022 | Endo | H03M 1/1019 |

OTHER PUBLICATIONS

C. Chen, et al., "A Micro-Power Two-Step Incremental Analog-to-Digital Converter," IEEE Journal of Solid-State Circuits, vol. 50, No. 8, Aug. 2015, 13 pages.

M. Pertjis, et al., "Precision Temperature Sensors in CMOS Technology," Springer, 2006, 30 pages.

M. Pertijs, et al., "A CMOS Smart Temperature Sensor With a 3σ Inaccuracy of +/− 0.1C from −55C to 125C," IEEE Journal of Solid-State Circuits, vol. 40, No. 12, Dec. 12, 2005, 11 pages.

K. Souri, et al., "A CMOS Temperature Sensor With a Voltage-Calibrated Inaccuracy of ± 0.15° C. (3σ) From −55° C. to 125° C." IEEE Journal of Solid-State Circuits, vol. 48, No. 1, Jan. 2013, 10 pages.

* cited by examiner

METHOD AND CIRCUIT FOR TEMPERATURE SENSING, TEMPERATURE SENSOR AND ELECTRICAL APPLIANCE

This patent application is a national phase filing under section 371 of PCT/EP2019/066052, filed Jun. 18, 2019, which claims the priority of European patent application 18181164.7, filed Jul. 2, 2018, each of which is incorporated herein by reference in its entirety.

TECHNICAL FIELD

The present disclosure is related to the field of low power temperature sensing. Specifically, the application is directed to a method and a circuit for temperature sensing, as well as to a temperature sensor and an electrical appliance.

BACKGROUND

Known approaches for low power temperature sensing sample the temperature at a very low rate with a low power analog-to-digital converter, ADC. Low rate means for example once per second. Low power temperature sensors normally use sigma-delta ADCs of higher order to reduce the time needed for conversion, and therefore the total energy consumed. In other words, actual solutions monitor temperature at constant interval and perform a measurement with full power consumption once per interval.

SUMMARY

In one embodiment a method for temperature sensing comprises the steps of feeding an analog signal comprising a first value of a temperature of an object, performing an analog-to-digital conversion of the analog signal using a first analog-to-digital converter, ADC, and therefrom providing a first digital signal representing an initial digital temperature value, performing an analog-to-digital conversion of the analog signal using a second ADC and therefrom providing a second digital signal representing a digital reference temperature value, regularly feeding the analog signal comprising a successive value of the temperature of the object and performing an analog-to-digital conversion of the analog signal using the second ADC, therefrom providing the second digital signal representing a successive digital temperature value, and calculating a digital delta temperature value according to a difference between the successive digital temperature value and the digital reference temperature value, repeating the latter step as long as the digital delta temperature value lies within a predefined range.

By regularly calculating the digital delta temperature value and its comparison with the predefined range, the method allows monitoring for a temperature change. Only if the temperature of the object has changed considerably, i.e. when the digital delta temperature value lies outside the predefined range, does the method restart by performing an analog-to-digital conversion of the analog signal using the first ADC. Consequently, power consumption is greatly reduced.

The predefined range is adjustable. It can be set to a certain value, for instance one Kelvin.

Also, the time interval for regularly feeding the analog signal and performing the analog-to-digital conversion using the second ADC is adjustable.

Therein, the repeating the latter step as long as the digital delta temperature value lies within a predefined range comprises keep iterating the steps of feeding the analog signal comprising an additional successive value of the temperature of the object, performing an analog-to-digital conversion of the analog signal using the second ADC and therefrom providing the second digital signal representing the additional successive digital temperature value, calculating a successive digital delta temperature value according to a difference between the additional successive digital temperature value and the digital reference temperature value and determining whether the successive digital delta temperature value lies within the predefined range.

In a development, the analog-to-digital conversion performed by the second ADC consumes less power than the analog-to-digital conversion performed by the first ADC. For example, the analog-to-digital conversion performed by the second ADC consumes less than twenty percent of the power consumed during the analog-to-digital conversion performed by the first ADC per conversion. In particular, the analog-to-digital conversion performed by the second ADC consumes less than five percent of the power consumed by the analog-to-digital conversion performed by the first ADC. More particularly, the analog-to-digital conversion performed by the second ADC consumes less than one percent of the power consumed by the analog-to-digital conversion performed by the first ADC.

For example, the first ADC has a power consumption in the order of eight Microwatt for four conversions per second, while the second ADC has a power consumption in the order of 80 Nanowatt for four conversions per second.

In a development, the analog-to-digital conversion performed by the first ADC is a sigma-delta conversion of first or higher order or a pipeline algorithmic conversion or a combination thereof and the first digital signal is provided with high accuracy. The analog-to-digital conversion performed by the second ADC is a successive-approximation conversion or a cyclic conversion or a combination thereof. The second digital signal is provided with lower accuracy than the first digital signal.

In an exemplary implementation the analog-to-digital conversion performed by the first ADC is a sigma-delta conversion and the first signal is provided with high accuracy, and the analog-to-digital conversion performed by the second ADC is a successive approximation conversion and the second digital signal is provided with a lower accuracy than the first digital signal. This means that for the analog-to-digital conversion performed by the second ADC an ultra-low power ADC can be used. Consequently, as the proposed method regularly measures the change of the temperature of the object by determining the digital delta temperature value, only the ultra-low power consumption second ADC is active most of the time. Therefore, power consumption of the proposed method is lower than in the state of the art temperature measurement.

The proposed method is especially advantageous in cases where temperature stays constant for hours. Also in cases where a rapid change in temperature of the object occurs, better tracking and detection of said change is enabled by the proposed method compared with state of the art temperature sensing employing a low sampling rate.

The proposed method is therefore based on an accurate temperature measurement using a high precision high power consumption first ADC only when needed, and regularly detecting temperature change with an ultra-low power second ADC.

As described above, the time interval in which the detection of the temperature change by calculation of the digital delta temperature value is performed can be adjusted. This time interval is also referred to as the sampling rate. Consequently, with the proposed method, the sampling rate can be higher and still the power consumption is lower than in state of the art implementations. In the case of a rapid change in temperature an accurate temperature measurement using the first ADC is triggered. Time that is spent with waiting for the next sampling event, which is typical in state of the art implementations, is avoided.

In a development the second ADC is using an internal analog signal of the analog-to-digital conversion performed by the first ADC. The internal analog signal is provided during the digital-to-analog conversion of the analog signal performed by the first ADC. The internal analog signal is provided as a function of an amplification of the analog signal or as a function of an amplification and integration of the analog signal.

In a development, the method is restarted if the digital delta temperature value lies outside the predefined range.

Restarting the method triggers an analog-to-digital conversion of the temperature of the object using the first ADC which provides the first digital signal representing a new initial digital temperature value with high accuracy.

Consequently, an accurate temperature conversion as performed by the first ADC is triggered when the temperature change detected by the ultra-low power second ADC, which repeatedly samples the analog temperature value and provides the digital value, in the previous execution round of the method lies outside the predefined range. Compared with state of the art temperature measurement at a fixed but low sampling rate employing a high precision ADC, power consumption is reduced by the proposed method and higher precision in the detection of temperature changes is achieved.

In a development feeding the analog signal comprises sampling an actual value of the analog signal representing the first, the successive value of the temperature of the object.

In a further development, the analog signal and the internal analog signal are both realized as differential signals.

In one embodiment a circuit for temperature sensing comprises a first ADC, a second ADC and a calculation unit. The circuit is prepared to be operated in either a first or a second mode of operation depending on a digital delta temperature value. In the second mode of operation less power is consumed than in the first mode of operation. The first ADC has an input for receiving an analog signal comprising a first value of a temperature of an object and an output for providing a first digital signal as a function of an analog-to-digital conversion of the analog signal. The first digital signal comprises an initial digital temperature value. The second ADC has an input which is coupled to the first ADC. The second ADC further has an output for providing a second digital signal as a function of an analog-to-digital conversion of the analog signal. The second digital signal comprises a digital reference temperature value or a successive digital temperature value. The calculating unit is coupled to the output of the second ADC and is configured to provide a digital delta temperature value according to a difference between the successive digital temperature value and the digital reference temperature value.

In the first mode of operation the initial digital temperature value is provided as a function of the first value of the temperature of the object received with the analog signal. As soon as the initial digital temperature value is determined, the circuit is operated in the second mode of operation. During said second mode of operation the second ADC first of all provides the digital reference temperature value by an analog-to-digital conversion of the first value of the temperature of the object. Next, the second ADC provides the successive digital temperature value as a function of an analog-to-digital conversion of a successive value of the temperature of the object provided with the analog signal. The calculating unit calculates the difference between the successive digital temperature value and the digital reference temperature value and therefrom provides the digital delta temperature value. In order to determine whether said delta temperature value lies within the predefined range represented e.g. by an upper and a lower threshold value, the calculating unit compares the digital delta temperature value with the predefined range. As long as the delta temperature value indeed lies within the predefined range, the circuit is operated in the second mode of operation and repeatedly the second ADC performs an analog-to-digital conversion of an additional successive temperature value of the object provided with the analog signal, therefrom provides an additional successive digital temperature value and the calculation unit determines an additional value of the digital delta temperature value from the difference between the additional successive digital temperature value and the digital reference temperature value, and compares said additional value of the digital delta temperature with the predefined range.

The described circuit enables low power temperature sensing compared with state of the art implementations.

The circuit as described can be employed as an example implementation for the method defined above. Thereby corresponding enhancements with respect to the state of the art are achieved.

For example, the second ADC is using an internal analog signal of the analog-to-digital conversion performed by the first ADC. Therein, the internal analog signal is provided during the analog-to-digital conversion of the analog signal performed by the first ADC, and is provided as a function of an amplification of the analog signal or as a function of an amplification and integration of the analog signal.

In a development, in the first mode of operation the first ADC is activated and the second ADC is switched off. In the second mode of operation the second ADC is activated, while the first ADC is switched off except for an operational amplifier of the first ADC.

The first ADC is implemented, for example, by a sigma-delta ADC of first or higher order or a pipeline algorithmic ADC or a combination thereof. The second ADC comprises, for instance, a successive approximation ADC or a cyclic ADC or a combination thereof. As a skilled person knows, a sigma-delta ADC consumes more power than a successive approximation ADC for the same speed and accuracy. Consequently, when activating the first ADC having the higher power, high precision sigma-delta ADC implementation only during the first mode operation and switching it off in the second mode of operation, power can be saved. The claimed circuit operates in the second mode of operation in which only the second ADC having a low power e.g. successive approximation ADC implementation is activated together with an operational amplifier of the first ADC as long as a temperature change reflected in the digital delta temperature value lies within a preset range.

In an exemplary implementation, in each conversion the second ADC consumes less than 20 percent, particularly less than five percent and more particularly less than one percent of the power consumed by the first ADC. Consequently, in the second mode of operation less than 20 percent, particularly less than five percent and more particularly less than one percent of the power consumed during the second mode of operation are consumed.

In a development, the circuit is operated in the first mode of operation while the first initial digital temperature value is provided. The circuit is operated in the second mode of operation as long as the digital delta temperature value lies within the predefined range.

In a development, the first ADC comprises the operational amplifier and a first comparator. The operational amplifier has an input for receiving the analog input signal and is configured for amplifying and/or integrating the analog input signal and therefrom providing an internal analog signal at its output. The first comparator is coupled to the output of the operational amplifier and is configured to provide at its output a digital bitstream signal as a function of the internal analog signal. The digital bitstream signal represents the first digital signal.

In a development, the circuit further comprises a main comparator which is configured to receive a delta temperature signal comprising the delta temperature value and a threshold signal comprising an upper and a lower threshold value and is configured to provide a control signal as a function of a comparison of the delta temperature value signal with the threshold signal. The control signal is provided to the first and to the second ADC for respective control thereof in the first and the second mode of operation.

In an additional development, the calculating unit comprises a memory component configured to store the digital reference temperature value, and a subtraction unit coupled to the output of the memory component. The subtraction unit is configured to subtract the digital reference temperature value from the successive digital temperature value and therefrom provide the digital delta temperature value.

In a development, the input of the second ADC is adapted for receiving the internal analog signal of the first ADC. The second ADC comprises a capacitive switching component having a number of capacitors and a number of switches, a second comparator coupled to the capacitive switching component, and a logic component coupled to an output of the second comparator and to the capacitive switching component. The logic component is configured to control the switches in combination with the capacitors during the second mode of operation according to a successive approximation algorithm by using the internal analog signal.

In the successive approximation under control of the logic component, the value of each bit of the second digital signal is determined depending on the output of the second comparator in a sequential manner.

In a development, the circuit further comprises a first scaling component coupled to the output of the first ADC, and/or a second scaling component coupled to the output of the second ADC. The first scaling component is configured to provide a first scaled digital signal comprising a scaled digital initial temperature value according to a scaling of the first digital signal comprising the initial digital temperature value. The second scaling component is configured to provide a second scaled digital signal comprising a scaled digital initial temperature value according to a scaling of the second digital signal comprising the successive digital temperature value or the additional successive digital temperature value.

In an embodiment a temperature sensor has an analog front end circuit and the circuit for temperature sensing as defined above. The analog front end circuit has at least two semiconductor devices which are configured to provide an analog temperature dependent signal. The circuit for temperature sensing is coupled to the analog front end circuit. The analog temperature dependent signal is provided to the input of the circuit for temperature sensing.

The analog temperature dependent signal provided by the analog frontend circuit is fed to the input of the circuit for temperature sensing. Consequently, the analog temperature dependent signal is used as the analog signal in the circuit for temperature sensing.

Compared to state of the art sensor, the specified temperature sensor enables temperature sensing with reduced power consumption.

The semiconductor devices are realized, for example, as transistors, especially bipolar transistors, or as thermistors, which are controlled to provide the temperature dependent analog signal. Said signal is proportional to absolute temperature, PTAT, or complementary to absolute temperature, CTAT.

In one embodiment an electrical appliance comprises a temperature sensor according to the above definition.

Realization of the electrical appliance using the specified temperature sensor with the temperature sensing circuit for sensing the temperature inside the electrical appliance and subsequent control of said temperature achieves a high reduction in power consumption with respect to the temperature sensing.

The electrical appliance can be realized as a refrigerator and/or a freezer or an air conditioner or an electronic device for temperature monitoring or a machine which needs temperature monitoring or an electronic power device or the like.

BRIEF DESCRIPTION OF THE DRAWINGS

The text below explains the proposed method for temperature sensing, the proposed temperature sensing circuit and the proposed temperature sensor in detail using exemplary embodiments with reference to the drawings. Components and circuit elements that are functionally identical or have the identical effect bear identical reference numbers. In so far as circuit parts or components correspond to one additional in function, a description of them will not be repeated in each of the following figures.

DETAILED DESCRIPTION OF ILLUSTRATIVE EMBODIMENTS

Figure 1:
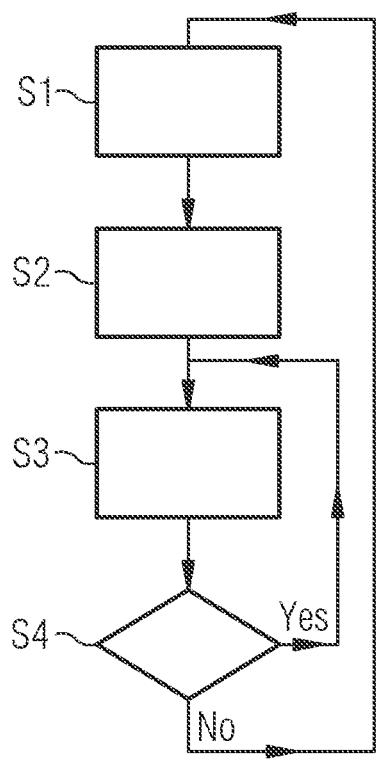
FIG. 1 shows an embodiment example of a method for temperature sensing as proposed.

FIG. 1 shows an embodiment example of a method for temperature sensing as proposed. The method is depicted in the form of a flowchart having the steps S1, S2, S3 and S4. The method starts out with an accurate conversion of a temperature of an object in step S1. Said accurate conversion S1 comprises the feeding of an analog signal comprising a first value of the temperature of the object, performing an analog-to-digital conversion of said analog signal using a first analog-to-digital converter, ADC, and therefrom providing a first digital signal representing an initial digital temperature value. Consequently, the initial digital temperature value is the digital representation of the analog first value of the temperature of the object.

In step S2 an ultra-low power, ULP, reference conversion is carried out. Said ULP reference conversion comprises performing an analog-to-digital conversion of the analog signal using a second ADC and therefrom providing a second digital signal representing a digital reference temperature value.

In step S3 a ULP delta conversion is performed which comprises feeding the analog signal comprising a successive value of the temperature of the object, performing an analog-to-digital conversion of the analog signal using the second ADC and therefrom providing the second digital signal representing a successive digital temperature value, and calculating a digital delta temperature value according to a difference between the successive digital temperature value and the digital reference temperature value.

The method proceeds with step S4 in which it is determined whether the digital delta temperature value lies within a predefined range. As long as the digital delta temperature value indeed lies within the predefined range, the method keeps iterating steps S3 and S4. In detail, in each iteration of step S3 the analog signal is fed once more and an actual value of the analog signal is sampled, this actual value of the analog signal represents a successive value of the temperature of the object. An analog-to-digital conversion of the analog signal using the second ADC is then performed which provides the second digital signal comprising a successive digital temperature value corresponding to the sampled actual value of the analog signal, i.e. the successive value of the temperature of the object. Again, a digital delta temperature value is calculated from the difference between the successive digital temperature value and the digital reference temperature value. In step S4 in each iteration it is checked whether the digital delta temperature value lies within the predefined range.

In the case that the digital temperature value lies outside the predefined range, meaning that the difference between the digital temperature value provided with the second digital signal in the current iteration and the digital reference temperature value is outside the predefined range, the method is restarted. Subsequently, a new accurate temperature conversion is performed according to step S1 as described above.

Due to the fact that a high precision, and consequently high power consuming, first ADC is only used in the step S1 and that for most of the time the low power second ADC is used in the iterative delta conversions in steps S3 and S4, the proposed method allows temperature sensing at a small fraction of the power consumption when compared with state of the art implementations. In an exemplary implementation, the second ADC consumes less than 20 percent of the power consumed by the first ADC. Particularly, the second ADC consumes less than five percent of the power consumed by the first ADC. More particularly, the second ADC consumes less than one percent of the power consumed by the first ADC.

Figure 2:
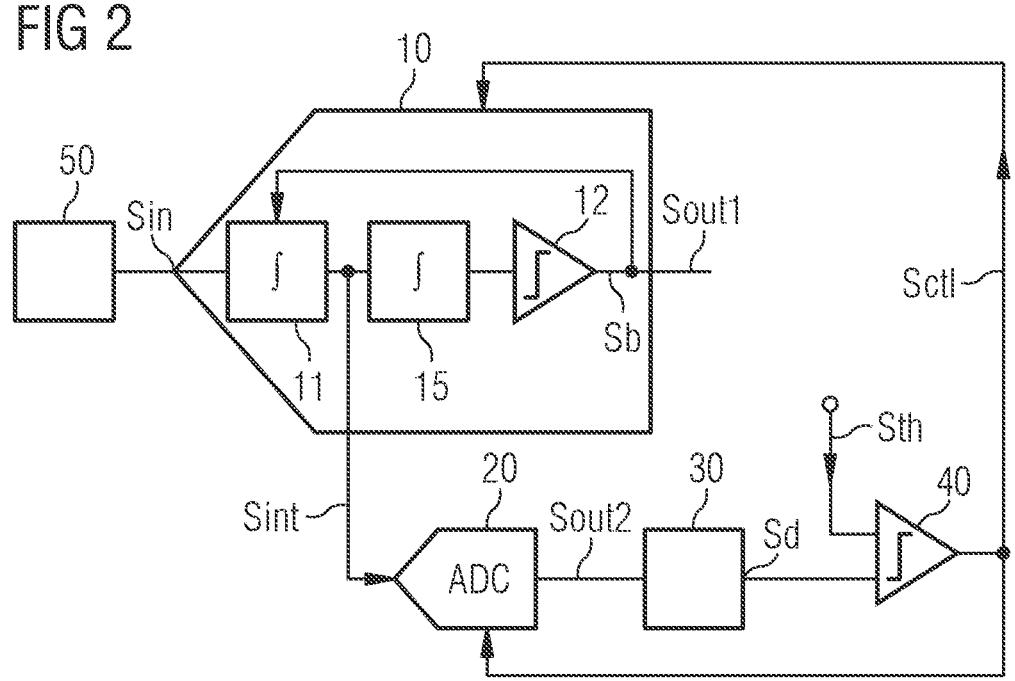
FIG. 2 shows a first embodiment example of a circuit for temperature sensing as proposed.

FIG. 2 shows a first embodiment example of a circuit for temperature sensing as proposed. The circuit comprises a first analog-to-digital converter, ADC, 10, a second ADC 20, and a calculating unit 30. The first ADC 10 has an input for receiving an analog signal Sin and an output for providing a first digital signal Sout1 as a function of an analog-to-digital conversion of the analog signal Sin according to step S1 of FIG. 1. The first digital signal Sout1 comprises an initial digital temperature value. The second ADC 20 has an input which is coupled to the first ADC 10. The second ADC 20 further has an output for providing a second digital signal Sout2 as a function of an analog-to-digital conversion of the analog signal Sin. The second digital signal Sout2 comprises a digital reference temperature value or a successive digital reference temperature value. The calculating unit 30 is coupled to the output of the second ADC 20 and is configured to provide a digital delta temperature value according to a difference between an actual digital temperature value provided with the second digital signal Sout2 and the digital reference temperature value. The delta temperature value is provided at the output of the calculating unit 30 by a delta temperature signal Sd.

Depending on the digital delta temperature value provided with the delta temperature signal Sd, the circuit is operated in either a first or a second mode of operation.

The first ADC 10 comprises a sigma-delta ADC, also known as delta-sigma ADC or sigma-delta modulator, whereas the second ADC 20 comprises a successive approximation, SAR, ADC. The circuit is operated in the first mode of operation while the first initial digital temperature value is provided in the form of the first digital signal Sout1. The circuit is operated in the second mode of operation as long as the digital delta temperature value comprised in the delta temperature signal Sd lies within a predefined range. In the first mode of operation the first ADC 10 is activated and the second ADC 20 is switched off. In the second mode of operation the second ADC 20 is activated, while the first ADC 10 is switched off except for an operational amplifier 11 comprised by the first ADC 10.

The circuit further comprises a main comparator 40 coupled to the output of the calculating unit 30. The main comparator 40 is configured to receive the delta temperature signal Sd and a threshold signal Sth which comprises an upper and a lower threshold value. The main comparator 40 is configured to provide a control signal Sctl as a function of a comparison of the delta temperature value signal Sd with the threshold signal Sth. The control signal Sctl is provided to the first and to the second ADC 10, 20 for respective control thereof in the first and the second mode of operation.

The first ADC 10 comprises the operational amplifier 11, and a first comparator 12 which is coupled to the output of the operational amplifier 11. The operational amplifier 11 is configured for amplifying and/or integrating the analog input signal ii and therefrom providing an internal analog signal Sint. The first comparator 12 is configured to provide at its output a digital bitstream signal Sb as a function of the internal analog signal Sint.

The first ADC 10 comprising the operational amplifier 11 and the first comparator 12 represents a sigma-delta ADC of first order. Optionally, the first ADC 10 may comprise a second operational amplifier and integrator 15 which is coupled between the operational amplifier 11 and the first comparator 12. Such implementation of the first ADC 10 is a sigma-delta ADC of a second order.

The amplifier 11 of the first ADC 10 represents a loop filter. Comparator 12 is a clocked comparator. As known to those skilled in the art, during every clock cycle of a clock generator used within the first ADC 10, the first comparator 12 produces a bit of the bitstream signal Sb based on the polarity of the internal analog signal Sint at the output of the amplifier 11. The bitstream signal Sb is fed back to the amplifier 11, so as to drive the output of the amplifier or integrator 11 to zero. The amplifier or integrator 11 accumulates a difference between the analog signal Sin and the quantized bitstream signal Sb. Due to the feedback of the bitstream signal Sb, a local average of the first comparator's 12 output tracks a local average of the analog signal Sin.

By the control signal Sctl either the first ADC 10 or the second ADC 20 is activated in dependence on the delta temperature signal Sd comprising the digital delta temperature value for realizing the first and the second mode of operation.

Compared to the state of the art, power is saved by mainly using the ultra-low power second ADC 20 comprising an SAR ADC and only switching on the high power sigma-delta ADC of the first ADC 10 when the delta temperature value lies outside the predefined range. As outlined before, the second ADC 20 only consumes a fraction of the power consumed by the first ADC 10. For example, the second ADC 20 consumes less than twenty percent, or particularly less than five percent or more particularly less than one percent of the power consumed by the first ADC 10.

Also, the sampling rate for a high precision temperature conversion can be adapted according to the temperature change.

FIG. 2 also shows an analog frontend circuit 50. The analog frontend circuit 50 has at least two semiconductor devices which are configured to provide an analog temperature dependent signal. The analog frontend circuit 50 will be described in more detail below with reference to FIG. 3. Whenever the analog frontend circuit 50 is coupled to the temperature sensing circuit as described in FIG. 2, a temperature sensor as proposed is formed. The analog temperature dependent signal provided by the analog frontend circuit 50 is fed to the input of the circuit for temperature sensing. Consequently, the analog temperature dependent signal is used as the analog signal Sin.

Figure 3:
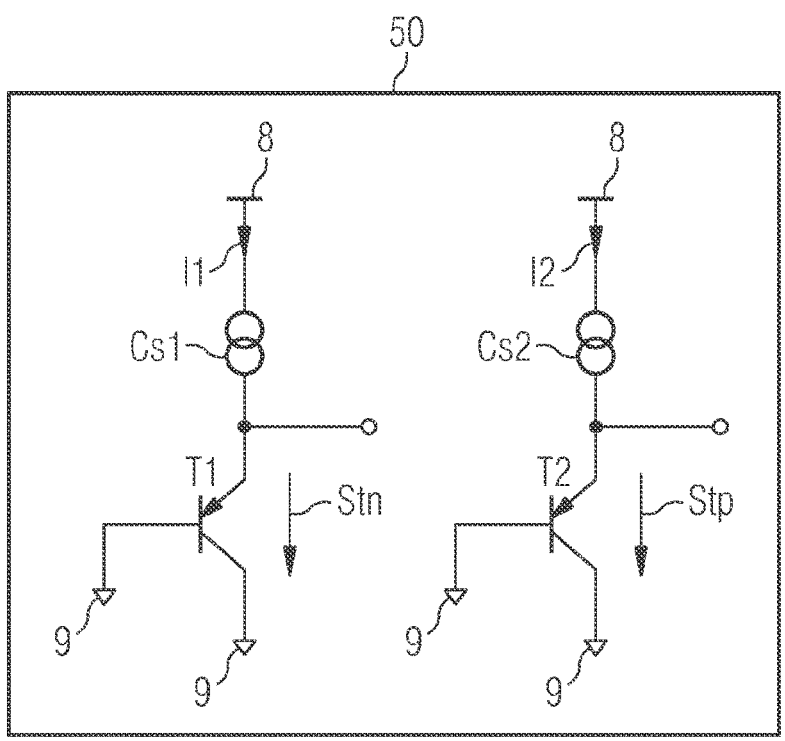
FIG. 3 shows an exemplary implementation of an analog frontend circuit.

FIG. 3 shows an exemplary implementation of an analog fronted circuit to be used with the temperature sensor as proposed. The analog frontend circuit 50 comprises a first and a second transistor T1, T2 and a first and a second current source Cs1, Cs2. The first and the second transistors T1, T2 are each realized as bipolar transistors. As depicted in FIG. 3, a base terminal of the first transistor T1 and a base terminal of the second transistor T2 are coupled to a reference potential terminal 9. A collector terminal of the first transistor T1 and a collector terminal of the second transistor T2 are also coupled to the reference potential terminal 9. The first current source Cs1 is coupled with one terminal to a supply potential terminal 8 and with its second terminal it is coupled to an emitter terminal of the first transistor T1. The first current source Cs1 is prepared to provide a first current I1. The second current source Cs2 is connected on the one hand to the supply potential terminal 8 and on the other hand to an emitter terminal of the second transistor T2. The second current source Cs2 is adapted to provide a second current I2, wherein a value of the second current I2 corresponds to n times the value of the first current I1. At the emitter terminal of the first transistor T1 a signal Stn is provided. In this implementation example the signal Stn corresponds to the base emitter voltage of the first transistor which depends on absolute temperature according to the following equation:

$$VBE = \frac{kT}{q} * \ln\left(\frac{Ic}{Is}\right)$$

Therein, k represents the Boltzmann constant, T represents the temperature in Kelvin, q represents the elementary charge, Ic represents the collector current and Is represents the saturation current.

The temperature coefficient is roughly indicated as minus two millivolt per Kelvin.

Consequently, the signal Stn is depending on the temperature of the first transistor T1.

Likewise, a signal Stp is provided at the collector terminal of the second transistor T2. The signal Stp corresponds in this implementation example to the base emitter voltage of the second transistor T2 and follows the same equation depicted above, i.e. the signal Stp is also dependent on absolute temperature in the form of a CTAT voltage due to the negative temperature coefficient of the base-emitter voltage.

When employing the analog frontend circuit 50 in a temperature sensor as proposed in connection with the temperature sensing circuit according to any of the embodiments described in this application, either the difference signal between the signal Stn and Stp is employed as the temperature-dependent signal and provided to the input of the first ADC as a differential signal, or just one component of said differential signal is used, either Stn or Stp.

Figure 4:
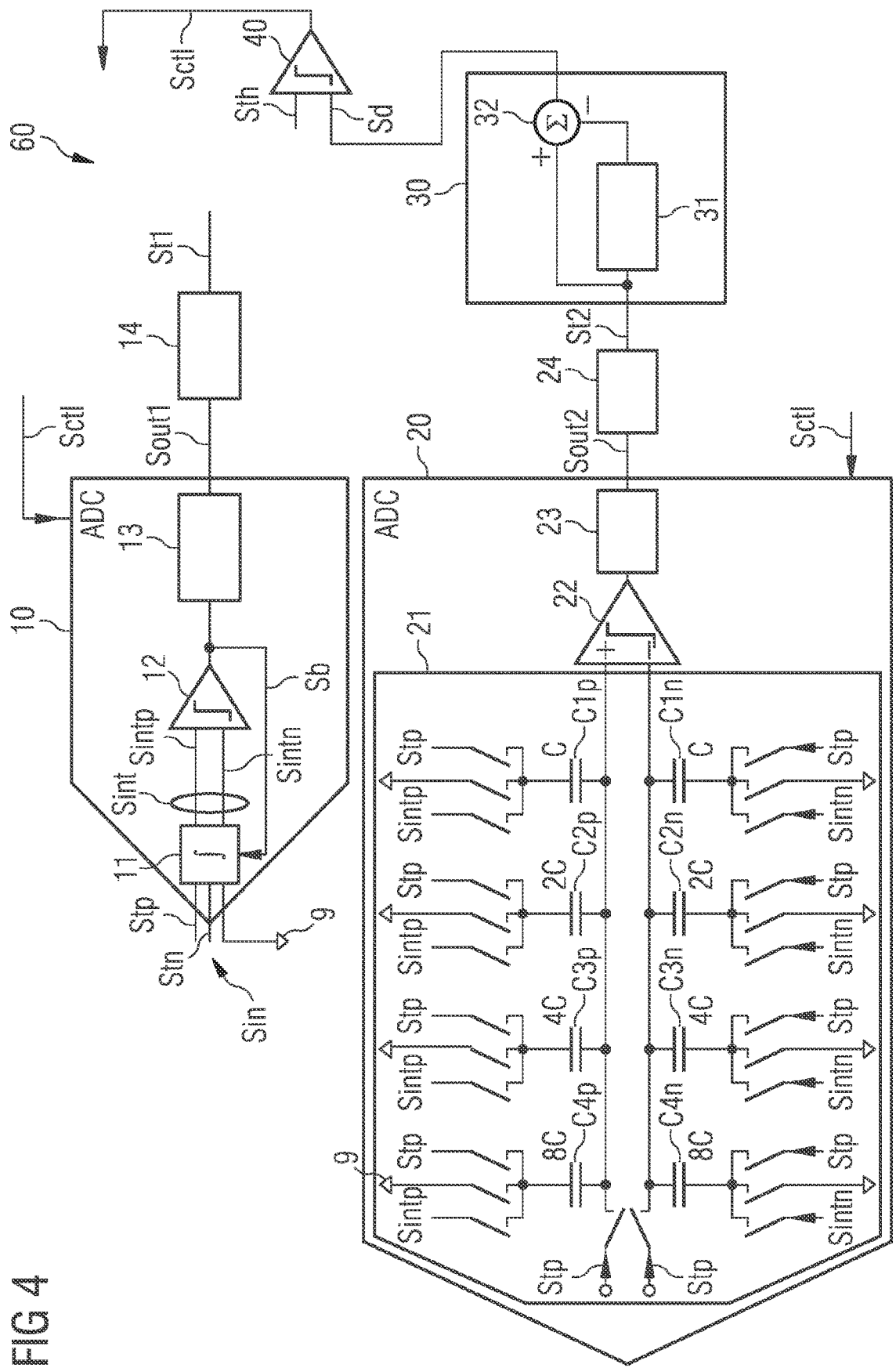
FIG. 4 shows a second embodiment example of a circuit for temperature sensing as proposed.

FIG. 4 shows a second embodiment example of a circuit for temperature sensing as proposed. The circuit for temperature sensing 60 shown in FIG. 4 coincides with the first embodiment shown in FIG. 2 except for some more details depicted in FIG. 4. The description of FIG. 2 therefore applies correspondingly to FIG. 4.

The first ADC 10 is realized in the present embodiment as a sigma-delta ADC of the first order having the operational amplifier 11, the first comparator 12 and a filter component 13. The operational amplifier 11 is supplied with the analog signal Sin which is realized as a differential signal comprising the signal Stp and the signal Stn as provided by the analog frontend circuit 50 as depicted in FIG. 3. By amplification and integration of the difference between the signals Stp and Stn the operational amplifier 11 provides the internal analog signal Sint. Said internal analog signal Sint is also realized as a differential signal having the components Sintp and Sintn which are provided to respective inputs of the first comparator 12. At the output of the first comparator 12 a single-ended digital bitstream signal Sb is provided as a function of the internal analog signal Sint. The bitstream signal Sb is fed back to the operational amplifier 11 and is also provided to an input of the filter component 13. After filtering the digital bitstream signal Sb the filter component 13 provides the first digital signal Sout1 at the output of the first ADC 10. The filtering by the filter component 13 comprises conversion to a 16 Bit code, for instance.

The temperature sensing circuit 60 depicted in FIG. 4 also comprises a first and a second scaling component 14, 24. The first scaling component 14 is coupled to the output of the first ADC 10 and is configured to provide a first scaled digital signal St1 comprising a scaled digital initial temperature value according to a scaling of the first digital signal Sout1 comprising the initial digital temperature value. Scaling therein refers to the formation of a digital value from a bitstream.

The second ADC 20 is realized as an SAR ADC which consumes a fraction, e.g. less than 20, five or one percent, of the power consumed by the first ADC 10. The second ADC 20 for instance consumes about 80 Nanowatt, while the first ADC 10 consumes about eight Microwatt for four conversions per second.

In detail, the second ADC 20 comprises a capacitive switching component 21, a second comparator 22 coupled to the capacitive switching component 21 and a logic component 23 coupled to an output of the second comparator 22 and to the capacitive switching component 21 for control thereof. The capacitive switching component 21 has a number of capacitors C1p, C2p, C3p and C4p, as well as C1n, C2n, C3n and C4n. The capacitance values of the capacitors used in the switching component 21 are scaled as indicated in FIG. 4. For instance, the capacitance value of the capacitor C1p corresponds to the value C, the capacitance of the capacitor C2p corresponds to the value of two times the value C, the capacitance of the capacitor C3p corresponds to the value of four times the value C and the capacitance of the capacitor C4p corresponds to the value of eight times the value C. Corresponding capacitance values are implemented in the capacitors C1n, C2n, C3n and C4n as indicated in FIG. 4.

The lower plates of capacitors C1p, C2p, C3p and C4p are connected to each other and to the non-inverting input of the second comparator 22. Said connection of lower plates of capacitors C1p, C2p, C3p and C4p is supplied with the signal Stp in a switchable manner. Likewise, the upper plates of the capacitors C1n, C2n, C3n and C4n are connected to one another and are coupled to an inverting input of the second comparator 22. Said connection of upper plates of the capacitors C1n, C2n, C3n and C4n is also supplied with the signal Stp in a switchable manner.

The upper plates of capacitors C1p, C2p, C3p and C4p are each respectively coupled to either an input which is supplied with the signal Sintp, or an input which is supplied with the signal Stp or to the reference potential terminal 9 in a switchable manner under control of the logic component 23. The reference potential terminal 9 is supplied with a ground voltage, for example.

In an analogous way, the lower plates of capacitors C1n, C2n, C3n and C4n are each coupled either to an input which is supplied with supplied with the signal Sintn, or to an input supplied with the signal Stp or to the reference potential terminal 9, respectively, in a switchable manner under control of the control logic 23.

The capacitors C4p and C4n having the highest capacitance value are used for determining the most significant bit, MSB, of the analog signal Sin represented by the internal signal Sintp, Sintn. Capacitors C1p and C1n having the lowest capacitance value are used to determine the least significant bit, LSB, of the analog signal Sin. In this manner, at the beginning of the reference conversion of step S2 of FIG. 1 or at the beginning of each iterative execution of step S3 of FIG. 1, in a so-called acquisition phase the upper plates of capacitors C1p, C2p, C3p and C4p of the capacitive switching component 21 are respectively connected to the terminal receiving the signal Sintp, while the lower plates of these capacitors are respectively connected to receive the signal Stp. Consequently, the capacitors C1p, C2p, C3p and C4p are each respectively charged to a voltage corresponding to the difference between a voltage of the signal Sintp and a voltage of the signal Stp. Likewise, the lower plates of capacitors C1n, C2n, C3n and C4n of the capacitive switching component 21 are respectively connected to the terminal receiving the signal Sintn, while the upper plates of these capacitors are respectively connected to receive the signal Stp. By this, the capacitors C1n, C2n, C3n and C4n are each charged to a voltage corresponding to the difference between a voltage of the signal Sintn and the voltage of the signal Stp.

Next, the logic unit 23 controls all switches of the capacitive switching component 21 in an open state.

Then the MSB is determined by connecting the upper plate of capacitor C4p to the signal Stp. Concurrently, the lower plate of capacitor C4n is connected to the ground potential terminal 9. Depending on the output of comparator 22, the logic component 23 decides whether the MSB remains at 1 as assumed beforehand or is set to 0.

Next, capacitors C3p and C3n are used to determine the value of the bit with the second significance in analogy to the determination of the MSB. Afterwards, capacitors C2p and C2n are analogously used to determine the bit of the third significance. Finally, capacitors C1p and C1n are employed to determine the LSB. The whole procedure follows the successive approximation algorithm known to those skilled in the art.

In the end of the conversion cycle the second ADC 20 provides the second digital signal Sout2 in the form of a bitstream comprising, in this example for each value of the analog input signal Sin converted in the cycle, four bits.

Scaling of the second digital signal Sout2 is performed in the second scaling component 24 at the output of which the second scaled signal St2 having the digital representation of the analog signal Sin in the form of a temperature value in kelvin, for instance, is provided. The second scaled signal St2 is propagated to the calculating unit 30.

The calculating unit 30 has a memory component 31 and a subtraction unit 32. A digital reference temperature value provided with the second digital signal Sout2 and with the second scaled signal St2 is stored in the memory component 31 for a later comparison with successive digital temperature values. By subtracting the digital reference temperature value from the successive digital temperature value in each cycle of step S3 of the method as depicted in FIG. 1, a digital delta temperature value is determined and provided with a digital delta signal Sd at the output of the calculating unit 30.

Said digital delta signal Sd is compared in the main comparator 40 to a threshold signal Sth representing the predefined range according to step S4 as of FIG. 1. As long as the digital delta signal Sd lies within the predefined range represented by the threshold signal Sth, the output of the main comparator 40 is at zero. Thereupon the second ADC 20 is activated to convert a successive value of the temperature of the object according to a next cycle of step S3 of the method depicted in FIG. 1.

Therein, the main comparator 40 may be implemented as a window comparator having an upper and a lower threshold value provided with the threshold signal Sth. Consequently, the predefined range is defined as the range between the upper and the lower threshold.

It can be seen that the second ADC 20 reuses the internal signal Sint provided by the operational amplifier 11 of the first ADC 10.

The implementation shown in FIG. 4 represents a very power-efficient implementation of a circuit for temperature sensing.

In the description the terms "coupled" and "connected" are used synonymously to designate a connection between two or more circuit elements. In implementations of the claimed circuit, other electrical elements, e.g. a resistor, may be in between the elements that are coupled or connected unless a direct connection is specified. Said direct connection implies an immediate connection without any other elements in between.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the low-pass filter arrangement as defined in the accompanying claims.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A method for temperature sensing, the method comprising:
providing an analog signal comprising a first value of a temperature of an object;
performing an analog-to-digital conversion of the analog signal using a first analog-to-digital converter (ADC) thereby providing a first digital signal representing an initial digital temperature value;
performing an analog-to-digital conversion of the analog signal using a second ADC thereby providing a second digital signal representing a digital reference temperature value;
regularly providing the analog signal comprising a successive value of the temperature of the object, performing the analog-to-digital conversion of the analog signal using the second ADC thereby providing the second digital signal representing a successive digital temperature value and calculating a digital delta temperature value according to a difference between the successive digital temperature value and the digital reference temperature value; and
repeating providing the analog signal, performing the analog-to-digital conversion of the analog signal using the second ADC and calculating the digital delta temperature value as long as the digital delta temperature value lies within a predefined range.

2. The method according to claim 1, wherein the analog-to-digital conversion performed by the second ADC consumes less power than the analog-to-digital conversion performed by the first ADC.

3. The method according to claim 1, wherein the analog-to-digital conversion performed by the second ADC consumes less than five percent of a power consumed during the analog-to-digital conversion performed by the first ADC.

4. The method according to claim 1, wherein the second ADC uses an internal analog signal of the analog-to-digital conversion performed by the first ADC, wherein the internal analog signal is provided during the analog-to-digital conversion of the analog signal performed by the first ADC, and wherein the internal analog signal is provided as a function of an amplification of the analog signal or as a function of an amplification and integration of the analog signal.

5. The method according to claim 4, wherein the analog signal and the internal analog signal are both realized as differential signals.

6. The method according to claim 1, wherein providing the analog signal comprises sampling an actual value of the analog signal representing the first, the successive or the additional successive value of the temperature of the object.

7. The method according to claim 1, further comprising, when the digital delta temperature value lies outside the predefined range, restarting by performing an analog-to-digital conversion of the analog signal using the first ADC.

8. The method according to claim 1,
wherein the first ADC implements a sigma-delta ADC of first or higher order or a pipeline algorithmic ADC or a combination thereof, and
wherein the second ADC implements a successive approximation ADC or a cyclic ADC or a combination thereof.

9. A circuit for temperature sensing comprising:
a first analog-to-digital converter (ADC) having an input configured to receive an analog signal comprising a first value of a temperature of an object and an output configured to provide a first digital signal as a function of an analog-to-digital conversion of the analog signal, the first digital signal comprising an initial digital temperature value;
a second ADC having an input coupled to the first ADC, the second ADC having an output configured to provide a second digital signal as a function of an analog-to-digital conversion of the analog signal, the second digital signal comprising a digital reference temperature value or a successive digital temperature value; and
a calculating unit coupled to the output of the second ADC, wherein the calculating unit is configured to provide a digital delta temperature value according to a difference between the successive digital temperature value and the digital reference temperature value,
wherein the circuit is configured to operate in either a first mode of operation or a second mode of operation depending on the digital delta temperature value, and
wherein the second mode of operation is configured to consume less power than the first mode of operation.

10. The circuit according to claim 9, wherein the second ADC is configured to use an internal analog signal of the analog-to-digital conversion performed by the first ADC, wherein the internal analog signal is provided during the analog-to-digital conversion of the analog signal performed by the first ADC, and wherein the internal analog signal is provided as a function of an amplification of the analog signal or as a function of an amplification and integration of the analog signal.

11. The circuit according to claim 9,
wherein, in the first mode of operation, the first ADC is activated and the second ADC is switched off,
wherein, in the second mode of operation, the second ADC is activated and the first ADC is switched off except for an operational amplifier of the first ADC, and
wherein the circuit is configured to operate in the first mode of operation while a first initial digital temperature value is provided, and
wherein the circuit is configured to operate in the second mode of operation as long as the digital delta temperature value lies within a predefined range.

12. The circuit according to claim 9, wherein the first ADC comprises a sigma-delta ADC of first or higher order or a pipeline algorithmic ADC or a combination thereof, and wherein the second ADC comprises a successive-approximation ADC or a cyclic ADC or a combination thereof.

13. The circuit according to claim 9,
wherein the first ADC comprises an operational amplifier with an input configured to receive an analog input signal, the operational amplifier being configured to amplify and/or to integrate the analog input signal thereby providing an internal analog signal at an output of the operational amplifier, and
wherein a first comparator is coupled to the output of the operational amplifier, the first comparator configured to provide a digital bitstream signal as a function of the internal analog signal at an output of the comparator, the digital bitstream signal representing the first digital signal.

14. The circuit according to claim 13,
wherein the input of the second ADC is configured to receive the internal analog signal of the first ADC, wherein the second ADC comprises a capacitive switching component having a number of capacitors and a number of switches, wherein a second comparator is coupled to the capacitive switching component, wherein a logic component is coupled to an output of the second comparator and to the capacitive switching component, and wherein the logic component is configured to control the switches in combination with the capacitors during the second mode of operation according to a successive approximation algorithm by using the internal analog signal.

15. The circuit according to claim 9, further comprising a main comparator configured to receive a delta temperature signal and a threshold signal, wherein the delta temperature signal comprises the delta temperature value, wherein the threshold signal comprises an upper and a lower threshold value, wherein the main comparator is configured to provide a control signal as a function of a comparison of the delta temperature value with the threshold signal, and wherein the control signal is provided to the first ADC and to the second ADC for respective control thereof in the first and the second modes of operation.

16. The circuit according to claim 9, wherein the calculating unit comprises a memory component configured to store the digital reference temperature value, and a subtraction unit coupled to the output of the memory component and configured to subtract the digital reference temperature value from the successive digital temperature value thereby providing the digital delta temperature value.

17. The circuit according to claim 9, further comprising:
a first scaling component coupled to the output of the first ADC; and/or
a second scaling component coupled to the output of the second ADC,
wherein the first scaling component is configured to provide a first scaled digital signal comprising a scaled digital initial temperature value according to a scaling of the first digital signal comprising the initial digital temperature value, and
wherein the second scaling component is configured to provide a second scaled digital signal comprising a scaled digital initial temperature value according to a scaling of the second digital signal comprising the successive digital temperature value or the additional successive digital temperature value.

18. A temperature sensor comprising:
an analog front end circuit having at least two semiconductor devices configured to provide an analog temperature dependent signal; and
the circuit for the temperature sensing according to claim 9 coupled to the analog front end circuit,
wherein the analog temperature dependent signal is provided to the input of the circuit for the temperature sensing.

19. An electrical appliance comprising:
the temperature sensor according to claim 18.

20. A circuit for temperature sensing comprising:
a first analog-to-digital converter (ADC) having an input configured to receive an analog signal comprising a first value of a temperature of an object and an output configured to provide a first digital signal as a function of an analog-to-digital conversion of the analog signal, the first digital signal comprising an initial digital temperature value;
a second ADC having an input coupled to the first ADC, the second ADC having an output configured to provide a second digital signal as a function of an analog-to-digital conversion of the analog signal, the second digital signal comprising a digital reference temperature value or a successive digital temperature value; and
a calculating unit coupled to the output of the second ADC, wherein the calculating unit is configured to provide a digital delta temperature value according to a difference between the successive digital temperature value and the digital reference temperature value,
wherein, when the digital delta temperature value lies within a predefined range, the second ADC is configured to perform the analog-to-digital conversion of the analog signal, and, when the digital delta temperature value lies outside the predefined range, the first ADC is configured to perform the analog-to-digital conversion of the analog signal.

* * * * *